United States Patent [19]
Kawada et al.

[11] Patent Number: 5,536,359
[45] Date of Patent: Jul. 16, 1996

[54] SEMICONDUCTOR DEVICE MANUFACTURING APPARATUS AND METHOD WITH OPTICAL MONITORING OF STATE OF PROCESSING CHAMBER

[75] Inventors: Hiroki Kawada, Ishioka; Kazue Takahashi, Kudamatsu; Manabu Edamura, Ibaraki-ken; Saburo Kanai, Hikari; Naoyuki Tamura, Kudamatsu, all of Japan

[73] Assignee: Hitachi, Ltd., Tokyo, Japan

[21] Appl. No.: 309,409

[22] Filed: Sep. 20, 1994

[30] Foreign Application Priority Data

Sep. 20, 1993 [JP] Japan .................................. 5-232793

[51] Int. Cl.$^6$ ................................... H01L 21/00
[52] U.S. Cl. .................. 156/626.1; 156/345; 216/60
[58] Field of Search ............................ 156/626.1, 657.1, 156/662.1, 345 MC, 345 P; 437/228 ST, 228 PE, 228 PC; 118/712; 134/1.1, 1.2, 1.3; 216/59, 60, 67

[56] References Cited

U.S. PATENT DOCUMENTS

| 4,328,068 | 5/1982 | Curtis ........................................ 216/60 |
| 5,232,537 | 8/1993 | Yachi . |
| 5,362,969 | 11/1994 | Glenn ............................. 156/626.1 X |

FOREIGN PATENT DOCUMENTS

| 61-183919 | 8/1986 | Japan . |
| 3-276657 | 12/1991 | Japan . |
| 4-012251 | 1/1992 | Japan . |
| 4-12251 | 1/1992 | Japan . |
| 4-136746 | 5/1992 | Japan . |
| 5-26737 | 7/1993 | Japan . |
| 5-259250 | 10/1993 | Japan . |

OTHER PUBLICATIONS

"Fourier Transform Infrared Studies of Polyimide and Poly-(methyl–methacrylate) Surfaces During Downstream Microwave Plasma Etching", J. Leu et al, 8257 a Journal of Vacuum Science & Technology, Nov./Dec. 1991, No. 6, New York, US, pp. 2948–2962.

Barner et al., "Polarization Modulation Fourier Transform Infrared Reflectance Measurements of Thin Films and Monolayers at Metal Surfaces Utilizing Real–Time Sampling Electronics", Anal. Chem., 1991, No. 63, pp. 55–60.

Mattson Instruments Research Laboratories, "Mid–Infrared Fiber Optics", Mar. 1992.

Suetaka, "Surface Infrared and Raman Spectroscopy", IPC, Nov. 30, 1990, from p. 7.

*Primary Examiner*—William Powell
*Attorney, Agent, or Firm*—Antonelli, Terry, Stout & Kraus

[57] ABSTRACT

A semiconductor device manufacturing apparatus and its method, measures the amount or chemical composition of reaction products adhering to or deposited on the inside of a processing chamber of the semiconductor device manufacturing apparatus, without exposing the chamber to the air. External light, such as infrared light, is introduced from a light introducing unit into the processing chamber. A light receiving unit provided outside the processing chamber receives light reflected from a specified location inside the processing chamber or light reflected from an arbitrary location inside the chamber. The received light is then subjected to spectrometry or photometry to judge how badly the chamber is contaminated and to judge the state of the process being carried out.

26 Claims, 5 Drawing Sheets

IN CASE OF THE ROD RETRACTED

IN CASE OF THE ROD PROTRUDED

FROM THE FT-IR                                TO THE DETECTOR 84

SEMICONDUCTOR DEVICE MANUFACTURING APPARATUS AND METHOD WITH OPTICAL MONITORING OF STATE OF PROCESSING CHAMBER

BACKGROUND OF THE INVENTION

The present invention relates to a semiconductor device manufacturing apparatus and a semiconductor device manufacturing method and more particularly to a semiconductor device manufacturing apparatus and a semiconductor device manufacturing method suitable for monitoring the conditions of reaction products produced during a processing in the apparatus.

Conventional dry etching apparatus have a problem that, as the number of wafers processed increases, the amount of dust generated increases, thereby destabilizing the process, gradually deviating the process condition from the initial state resulting in unfavourable products, and reducing the yield. It is considered the reason for this is that reaction products are deposited on the inner walls of the processing chamber and on the surface of components, and dust particles are produced from the reaction products, destabilizing the process. The process destabilization may also result from other causes.

It has been found that cleaning the apparatus to remove the deposited reaction products (hereinafter referred to as "deposited materials") recovers the yield, but usually this requires exposure of the process chamber to the air. Once the apparatus is exposed to the air, however, it is necessary to perform evacuation again and to set the conditions for process stabilization before the wafer processing is restarted. This results in a lowering of the working ratio (efficiency) of the apparatus.

Because lowering the frequency of the chamber cleaning lead to an improved working ratio of the apparatus, it is important to make a correct decision as to the time to perform the cleaning, and to perform the cleaning in such a way as to make it possible to increase the time before cleaning is needed again as along as possible. Determining the correct time for cleaning, however, is difficult under the present situation. Among the methods of determining the cleaning time are one in which a dummy wafer is processed and the amount of dust adhering to it is taken as a reference, and one in which the amount of dust generated in the apparatus is monitored. The difficulty with these methods lies in the fact that there are large variations in dust generation and the amount of dust adhering to the wafer is unstable.

Studies have been conducted to determine process requirements for suppressing the generation of deposited materials to a minimum level and to determine kinds of special gases suited for removing deposited materials. For this purpose, it is necessary to examine the state of deposited material adhering to the chamber, as well as the analysis of the deposited material itself.

Though the process chamber is exposed to the air to sample the deposited material for analysis, it is impossible to analyze the deposited material while the process is under way. The examination of the deposited material, therefore, is greatly restricted at present. It is also impossible to investigate how the deposited material is being produced with the lapse of time. It is therefore necessary to develop a method of determining the amount of deposited material and monitoring the state of deposition without exposing the apparatus to the air.

Among the methods of measuring the amount of deposits or reaction products, there is a method in which a reflector is installed inside the process chamber, light is projected through a window formed in the chamber, and the reflection factor is measured to estimate the amount of deposited material in the chamber, as described in Japanese Utility Model Publication No. 26737/1993.

Other related methods are disclosed in Japanese Patent Laid-Open No. 183919/1986, 276657/1991 and 12251/1992.

A conventional technique using a reflector needs an optical path from the window to the reflector, restricting the location of measurement inside the chamber. In apparatuses, such as a microwave plasma etching apparatus, which require that a window is provided and that the chamber is enclosed with an electromagnet, it is difficult to add a flange to the side of the chamber. It is also difficult to examine the composition of the deposited material and how it adheres to the chamber, as well as the amount of deposited material.

SUMMARY OF THE INVENTION

In a semiconductor device manufacturing apparatus and method, the present invention has the objective to easily determine, in situ, the amount of deposited material adhering to the inside of the chamber by measuring the amount of light reflected diffusely by the inner surface of the chamber.

To achieve the above objective, according to this invention, light is made to enter the apparatus through an optical-fiber and to be reflected diffusely in the chamber. The various features of a semiconductor device manufacturing apparatus according to this invention will be described below.

(1) The apparatus includes a chamber and a transparent member through which light is transmitted. Light is directed to the interior of the chamber through the transparent member. By performing at least one of spectrometry and photometry, it is possible to examine the state of the interior of the chamber, including the material deposited on the inner surface of the chamber and the chemical species present in the chamber, without exposing the chamber to the air.

(2) The apparatus includes a chamber, a transparent member installed on the side of a light source which introduces light into the chamber, and another transparent member operatively associated with at least one of a photometer and a spectrometer to take out reflected light directly from the inner surface of the chamber.

(3) The apparatus includes a chamber and a transparent member through which light is transmitted. Instead of introducing light to the interior of the chamber, as in (1), light is reflected within the transparent member and multiply reflected light is subjected to at least one of spectrometry and photometry to examine the state of the interior of the chamber, i.e. to measure the amount, composition and/or property of the material adhering to the surface of the transparent member, without exposing the interior of the chamber to the air.

(4) The apparatus includes a chamber and one or more transparent members, located inside the chamber, through which light is transmitted. The transparent members are optically connected to an optical fiber, through which external light is directed into the chamber. Light multiply, reflected inside the transparent member is taken out by the optical-fiber and subjected to at least one of spectrometry and photometry in order to make it possible to monitor the reaction, deposition and etching processes in the area where the transparent members are installed while these processes are under way.

(5) In any one of the above modes (1) to (4), a moving mechanism is provided to project and retract the transparent member into and out of the chamber, or to move it to a particular location in order to prevent the surface of the transparent member from being corroded and therefore its transmission factor from varying.

(6) In any one of the above modes (1) to (4), a shutter is provided which can cover the transparent member to prevent the surface of the transparent member from being corroded and therefore its transmission factor from varying.

The method of manufacturing semiconductor devices according to this invention has one of the following features.

(7) Light is introduced into the chamber of a semiconductor device manufacturing apparatus through a transparent member to illuminate the interior of the chamber, and the reflected light from the inner wall of the chamber is subjected to at least one of spectrometry and photometry to monitor the state of the interior of the chamber without exposing the chamber to the air.

(8) Light is reflected inside the transparent member, which is so arranged that one end thereof is exposed within chamber, and the multiply-reflected light is subjected to at least one of spectrometry and photometry to measure the state of the interior of the chamber, i.e. to measure the amount, composition and/or property of the material adhering to the surface of the transparent member without exposing the chamber to the air.

(9) An optical fiber is optically connected to the transparent member, which is so arranged that one end thereof is exposed within the chamber, to introduce external light into the interior of the chamber, and—reflected light that has been internally reflected inside the transparent member is picked up by the optical fiber and subjected to at least one of spectrometry and photometry to monitor the state of the interior of the chamber while the process is under way. The use of the optical fiber makes it possible to direct light upon a particular location in the chamber and to make a spectral analysis of the reflected light.

(10) In the above method (7), (8) or (9), the state of the material deposited on the inner surface of the chamber, chemical reactions and the state of process are selected as the state of the interior of the chamber.

(11) In any one of the above methods (7) through (10), the transparent member is a window (for instance, a quartz window) formed in the chamber; microwaves are introduced from the front of the window; light is directed into the window from the side of the window; and the light reflected in the interior of the window is taken out from the side of the window and is subjected to at least one of spectrometry and photometry to estimate the amount and properties of the material deposited inside the window of the chamber while the process is under way.

(12) In any one of the above methods (7) through (10), the monitoring of the state inside the chamber is carried out before or after at least one of the processes-deposition on a wafer and etching thereof occurs.

(13) In any one of the above methods (7) through (10), the result of measurement of the light reflected inside the chamber or the transparent member is used to display an instruction to clean the chamber by removing the material adhering to the interior of the chamber.

(14) In any one of the above methods (7) through (10), in regard to the process of removing material adhering to the interior of the chamber, at least any one of the operation of automatic start, stop, and control may be carried out based on the result of measurement of the light reflected in the chamber or the transparent member.

(15) In any one of the above methods (7) through (10), at least one of the result of measurement and the state of process is displayed based on the result of measurement of the light reflected in the chamber or the transparent member.

(16) In any one of the above methods (7) through (10), the state of process is controlled based on the result of measurement of the light reflected in the chamber or the transparent member.

(17) In any one of the above methods (7) through (10), at least one of the introduced light and the outgoing light is infrared light. That is, an apparatus having a measuring device for measuring the intensity of reflected light is used, the light used is an infrared beam, and an infrared spectrometry of the reflected light is performed. The chamber of the apparatus may be provided with, for example, a window for internally reflecting infrared light. Like a microwave plasma etching apparatus, infrared light may be introduced from the side of the microwave introducing quartz window.

(18) In any one of the above methods (7) through (10), the technique for analyzing the light may be a Fourier-transform spectroscopy.

Further, a dry etching apparatus, a modification of the semiconductor device manufacturing apparatus of this invention includes at least a chamber in which etching is performed, a magnet for generating a magnetic field, an electromagnetic wave source for generating electromagnetic waves, and an apparatus or method described in one of the above items (1) through (18).

This invention can also be applied to a functional member using a thin film, which is represented by a semiconductor device manufactured by an apparatus or method mentioned in one of the items (1) through (18).

In other words, according to this invention, the reflected light from the inner surface of the chamber or internally reflected light (multiply-reflected light in particular) from the inner surface of the window (quartz window) is subjected to photometry or spectrometry.

An application of this invention involves the inner surface of the chamber being scanned with a focused infrared beam to examine the distribution of the amount and composition of deposited material at each scanned point.

According the invention having the configuration mentioned above, light is introduced into the chamber through an optical fiber. The light is reflected diffusely in the interior of the chamber and the intensity of the reflected light that has come out of the chamber through a light-receiving optical fiber is measured. As the amount of deposited material increases, the amount of light being measured decreases. Therefore, it is possible to estimate the amount of deposited material and determine the correct timing to clean the chamber, without exposing the chamber to the air.

By introducing infrared light and by performing spectrometry of the infrared light reflected from the inner surface of the chamber and a window on which deposited material is present, it is possible to measure the chemical composition of deposited material and its state of adhesion to the substrate, without exposing the chamber to the air, even while the manufacturing process is being controlled. Based on the data, the timing to clean the chamber can be determined along with the deposited material removing process.

According to the invention, the method using a window does not utilize the reflected light from the surface of the chamber but multiply-reflected light from the interior of the window. Another method of this invention that utilizes the reflected light from the inner surface of the chamber does not use a reflector, but uses the reflected light coming directly from the inner surface of the chamber itself. Both methods permit composition analysis of deposited material by spectroscopy.

As a semiconductor device manufacturing apparatus of this invention, a film forming apparatus, an etching apparatus, and an asher are examples. As film forming apparatus, there is a chemical vapor deposition (CVD) apparatus and a molecular beam epitaxy (MBE) apparatus that use gas or a solid as a filming source. These apparatuses are equipped with an evacuation means for reducing the pressure within the processing vessel below the atmospheric pressure.

BRIEF DESCRIPTION OF THE DRAWINGS

FIG. 3A representing a case where the quartz rod is retracted from the chamber and FIG. 3B representing a case where the quartz rod is projected into the chamber;

DESCRIPTION OF THE PREFERRED EMBODIMENTS

First, a method of measuring reflected light will be described, and then an example of application of this method in an overall process flow will be described.

Figure 1:
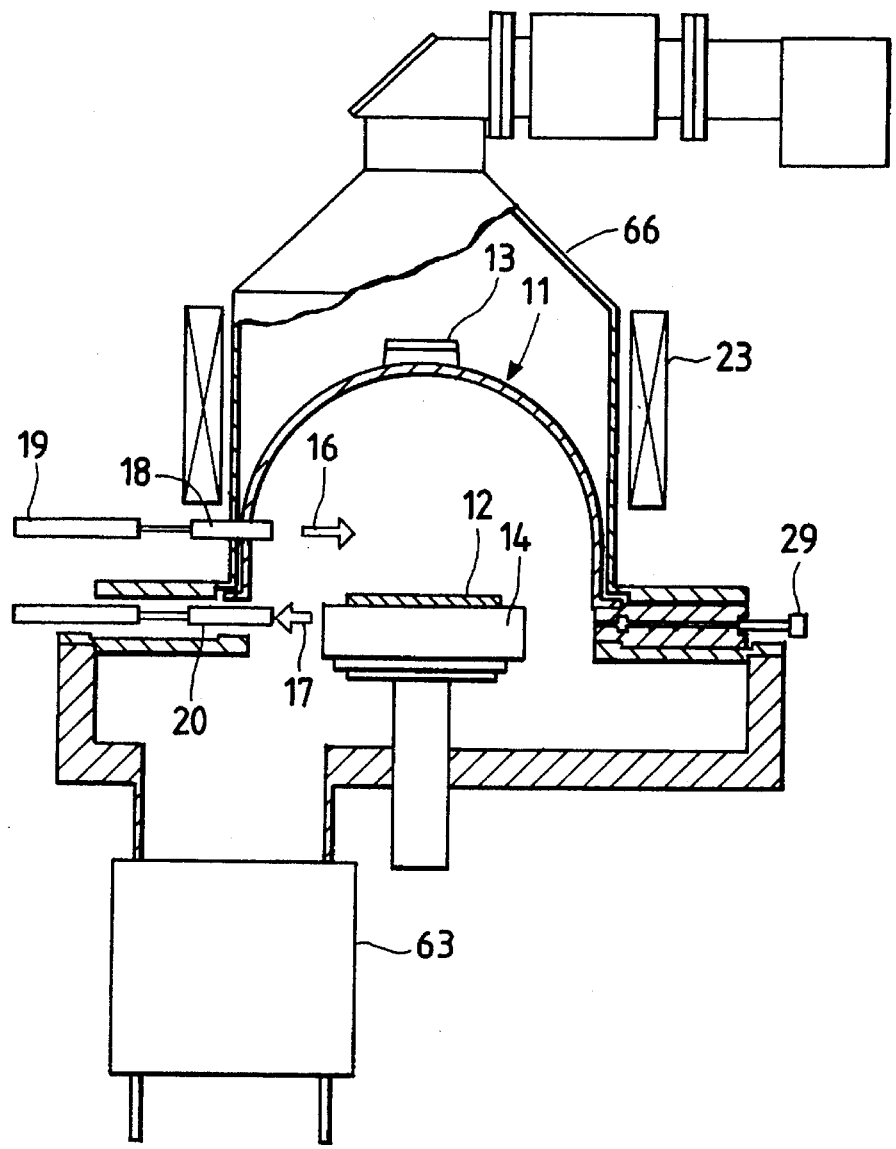
FIG. 1 is a partly sectional view of a microwave plasma etching apparatus, representing one of the semiconductor device manufacturing apparatuses to which an embodiment of this invention is applied.

(1) Method of Measuring the Intensity of the Reflected Light from Inside the Chamber FIG. 1 shows a microwave plasma etching apparatus forming an embodiment of the semiconductor device manufacturing apparatus of this invention. In the microwave plasma etching apparatus a wafer 12 is placed face up on a wafer holder 14 in the chamber 11. Microwaves that have passed through a waveguide 66 are introduced into the chamber 11 from a quartz window 13 provided in the upper part of the chamber 11.

Also admitted into the chamber 11 through a gas introducing means 29 is a reactive gas, such as $Cl_2$, $CHF_3$, $CH_2F_2$, $BCl_3$, etc., which is activated by microwaves and a high frequency applied to the wafer 12 to produce a plasma in the chamber 11, causing radicals of gas molecules, ions and electrons produced in the chamber to etch the surface of the wafer 12. At this time, gases produced in the chamber 11 have a variety of molecular states, a part of which forms material deposited on the inner surface of the chamber 11.

Measurement of the amount of deposited material in the chamber is carried out by directing light 16 onto the inner surface of the chamber 11 and measuring the intensity of diffusely reflected light 17. In FIG. 1, a halogen lamp of about 100 W is used as a light source. The light is introduced through a concave mirror and a focusing lens into a quartz rod 19 of a light introducing unit 18 and is then emitted from the end of the quartz rod inside the chamber 11. Although the embodiment uses visible light in a wide range of wavelengths, it is possible to use light of particular wavelengths as required, such as ultraviolet light, infrared light, and laser light.

As the process progresses, material is deposited on the inner surface namely, the wall of the chamber and on objects being processed, such as wafers, placed inside the chamber. As the amount of deposited material increases, the wall surface and the surface of the objects are increasingly colored and the portion of light introduced into the chamber that is absorbed by the deposited material also increases, attenuating the intensity of the incident light. The diffusely reflected light 17 is collected by a light receiving unit 20 and directed to a light measuring instrument. By measuring the total amount of light that has been diffusely reflected at various locations in the chamber 11, it is possible to check the overall change in the amount of deposited material inside the chamber 11.

Although the amount of deposited material at a particular location can be determined, it may be impossible to deal with a variety of processes, if the location of measurement is restricted, because the distribution of deposited material will generally change as the contents of the process change.

Figure 2:
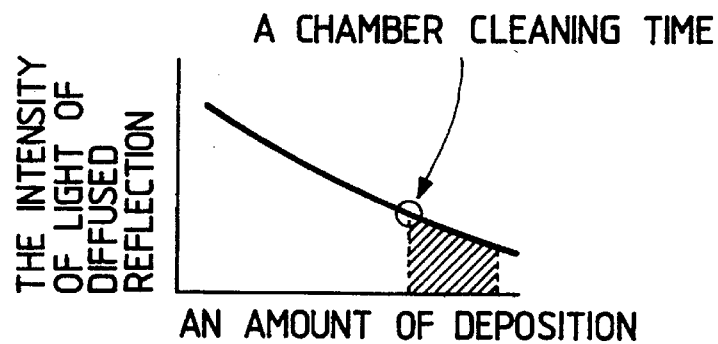
FIG. 2 is a diagram showing the relationships between the amount of diffusely reflected light and the amount of deposited material.

As shown in FIG. 2, when the amount of diffusely reflected light is smaller than a certain reference value, it is judged that the amount of deposited material exceeds an allowable value determined for securing a specified yield and it is determined that chamber cleaning is to be performed. This decision method and the detailed procedure to be used during the process will be described later.

The location where the light receiving unit 20 is installed should be selected in such a way that the light emitted from the light source is not received directly without being reflected by the inner surface of the chamber 11.

Another example of an arrangement may comprise a small shutter provided near the light receiving unit 20 or the light introducing unit 18, or may use a partly opaque light receiving unit 20 and light introducing unit 18 to prevent direct reception of light from the light introducing unit 18 into the light receiving unit 20. It is also possible to provide two or more light receiving units 20 and light intensity measuring devices.

Instead of using the quartz rod 19, it is possible to use an optical fiber or provide a window through which to project light inside the chamber 11. The light source and the light introducing unit 18 may be provided at more than one location.

An optical fiber or a window may be substituted for quartz rod 19. The light intensity measuring device also may be located inside the chamber 11. The light intensity measuring device may be one which is designed to measure the light intensity over a wide wavelength range, or one that measures a particular narrow range of wavelength. A light intensity measuring device, such as photomultiplier or photon counter may be used.

Instead of providing a light source, it is possible to use light that is inherently present in the chamber, such as plasma-generated light and light emitted from a filament of an instrument installed in the chamber 11, and to examine this light reflected by the inside of the chamber.

To make easier to detect the attenuation in the reflected light caused by deposited material, the reflection factor of the inner surface of the chamber itself 11 may be set high. This is because degradation in the reflection factor caused by deposited material is more pronounced as the reflection factor, when there is no deposited material, is higher. For example, the absolute surface roughness of the machined inner surface may be set to about 0.5 s (<0.5 μm).

An electromagnet 23 and a vacuuming system 63, which are conventionally provided in microwave plasma etching apparatuses, are not needed in this embodiment.

This embodiment allows measurement of the amount of deposited material without exposing the chamber 11 to the air. The deposited material may be a source of dust, destabilizing the manufacturing processes and reducing the yield of the wafers 12. This invention enables correct determination of the timing to clean the apparatus to remove deposited material, thereby reducing the frequency of cleaning and improving the working ratio of the apparatus.

While this embodiment measures the amount of diffusely reflected light 17, it is possible to subject the reflected light to spectrometry to examine the chemical composition of the deposited material. The measurement by means of a spectrometer will be described later in more detail.

Figure 3A:
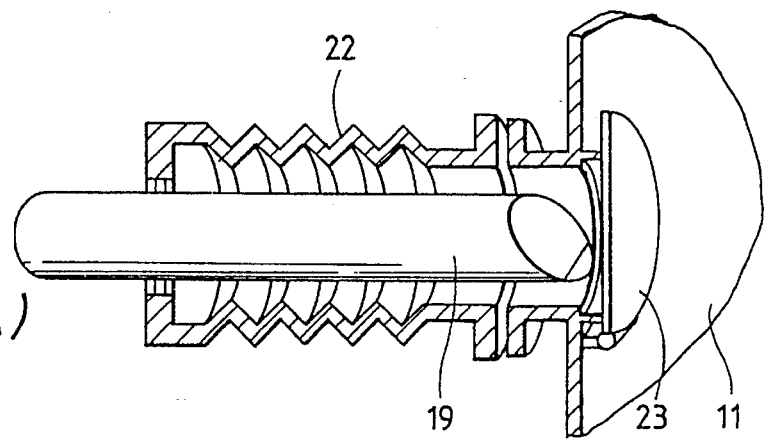
FIGS. 3A and 3B are detail views of a mechanism used in an embodiment of this invention that protects the quartz rod from damage.

The front end of the light introducing unit 18 and the light reception face of the light receiving unit 20 may be damaged by the plasma during the wafer processing, resulting in a change with time in the amount of transmitted light irrespective of the deposited material in the chamber 11. Hence, a mechanism as shown in FIG. 3(A) is used to prevent damage to these light transmitting surfaces.

Figure 3B:
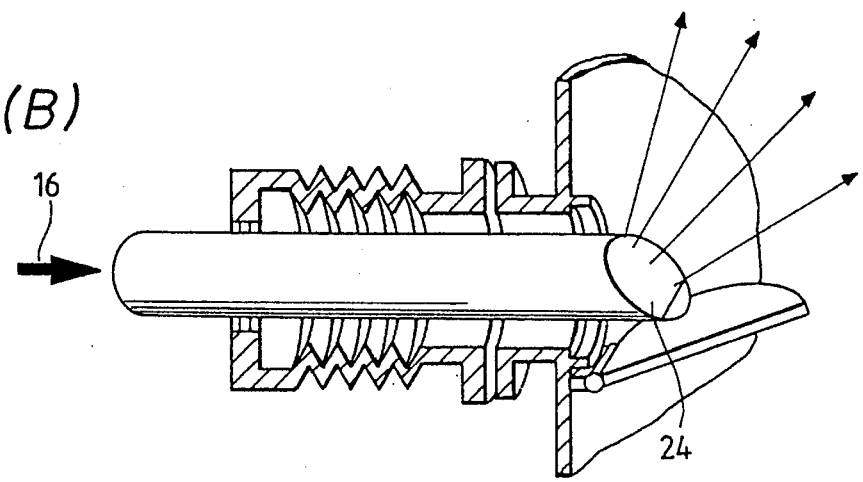

The front end of the quartz rod 19 is projected into and retracted from the chamber by the expansion and contraction of the bellows 22. When the wafer 12 is undergoing a processing, such as etching, in the chamber 11, the quartz rod 19 is retracted and a cover 23 is closed so that radicals, ions and electrons produced during the processing of the wafer 12 do not strike the quartz rod 19. When the processing is finished and there are no particles that will damage the quartz rod 19, the bellows 22 is contracted to move the front end of the quartz rod 19 into the chamber as seen in FIG. 3(B). At the same time, the cover 23 is pushed open to emit light or receive reflected light.

A space defined by the cover 23 and the bellows 22 is evacuated to create a vacuum and thereby prevent possible damage from corrosive gas. Because the side surface of the quartz rod 19 is covered with an aluminum thin film, light entering from one end of the rod repeats internal reflection before exiting from the other end. In this way, light is transmitted between the atmosphere side and the interior of the chamber. An optical fiber may be used instead of the quartz rod 19.

This is how the light illuminated surface and the light receiving surface 24 are protected against damage. The incoming light 16 can thus be introduced into the chamber 11 without being attenuated, and the reflected light can be taken out without being attenuated.

(2) Example of Application in the Whole Process

How information as to the amount of deposited material in the chamber thus measured is utilized in the entire flow of the process will be described in the following.

(2.1) Preparation Before Mass Production

Figure 4:
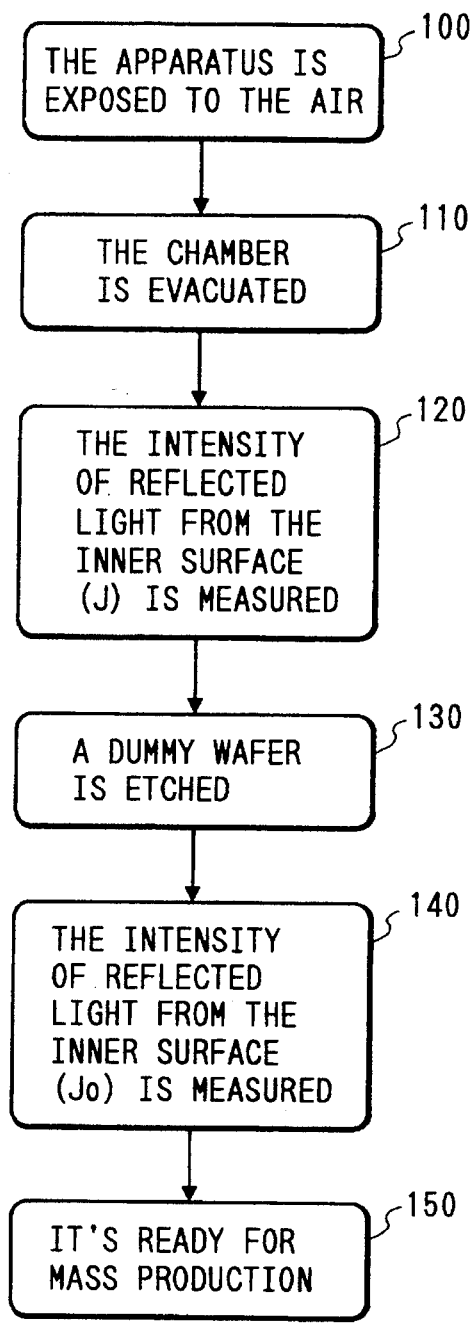
FIG. 4 is a flow chart of a procedure for measuring the amount of reflected light according to a method of this invention, in preparation for mass production.

First, the preparatory procedure for the apparatus before starting a normal etching of the wafer 12 is shown in FIG. 4. Explanation starts from the point immediately after the apparatus is exposed to the air and the internal deposited material is cleaned (step 100).

After cleaning, the interior of the chamber is evacuated to about 1 Pa to 0.1 Pa (step 110). During the evacuation, or after the pressure in the chamber is stabilized, a measurement is carried out as to the amount of reflected light from the interior of the chamber in the way already described (step 120). At this point, because no material adheres to the inside of the chamber, the amount of light reflected by the inner surface of the chamber is measured.

The amount J of light measured by the light intensity measuring device is recorded each time the apparatus is cleaned. This is compared with previous values that are similarly recorded when the equipment is exposed to the air. The value J should decrease slowly with degradation of the light source and the light intensity measuring device. If, in contrast with this tendency, the value J reduces sharply, it can be assumed the cleaning of the chamber to remove deposited material may have been done poorly, that something is wrong with the optical system, or that the light receiving surface may have been fouled during the cleaning operation. In this case, a check must be made by exposing the apparatus to the air. This check may be carried out before evacuation. Because the value J is inherent in the optical system, it is used in determining the reflection factor of the deposited material.

Next, a process gas is actually caused to flow to etch a dummy wafer (step 130) to deposit a thin film on the inner surface of the chamber. This is what is done in a conventional process. After this point, in the etching process, the material of the chamber is not exposed. All the wafers are etched in a state that the inner wall is covered with deposited material. Consequently, it is necessary to first deposit material on the inner surface of the chamber to stabilize the process. When the process is completed, the amount ($J_0$) of reflected light from the interior of the chamber is measured (step 140).

The amount of reflected light from the inner surface of the chamber decreases as the amount of deposition increases. The attenuation factor ($P_{\bar{0}}$) is normalized by the value (J) measured during the preparation of the apparatus, and is expressed as $$P_0 = J_0/J$$

This value represents the amount of the first deposited material, which is used as an initial value for the monitoring of subsequent increases in deposition (step 150).

(2.2) Starting Mass Production

Figure 5:
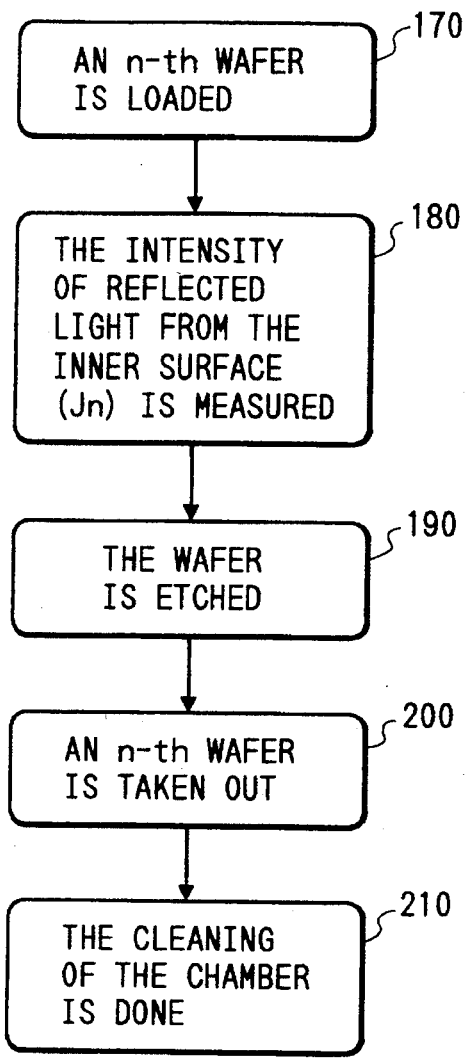
FIG. 5 is a flow chart of a procedure for measuring the amount of reflected light according to a method of this invention in a normal etching process.

With the above steps taken, the apparatus preparation is completed, and this is followed by the repetition of the normal etching process. The procedures of the normal etching process are shown in FIG. 5.

First, an n-th wafer (n is the number of the repetition) is loaded into the chamber (step 170), where it is cooled to about −30° C. Meanwhile, the intensity of reflected light (Jn)

from the interior of the chamber is measured. The reflection factor Pn, as in the preceding cases, is determined as follows:

$$Pn = Jn/J$$

Next, a normal wafer etching process is carried out (step 190). Material produced by the etching of the n-th wafer is deposited on the inner surface of the chamber.

After the etching is finished, the wafer is taken out of the chamber (step 200).

After this, the cleaning of the chamber is carried out (step 210). This consists of introducing a reactive gas into the chamber and producing a plasma, as when performing an etching, to remove the deposited material on the inner surface of the chamber by the etching reaction. Only by this processing, however, it is impossible to completely remove the deposited material. As the number of wafers to be processed increases, more of the deposited material will gradually accumulate in the chamber.

After the cleaning is completed, the next (n+1)-th wafer is loaded into the chamber and similar etching process and measurement of the reflected light intensity are repeated.

(2.3) Method of Determining the Time to do Cleaning

As the processing is repeated, the amount of deposited material increases and the value of $P_k$ ($=J_k/J$, where k=1, 2, 3, ...) tends to decrease. To which level the $P_k$ value can decrease before a problem arises with the process is estimated from the past records of similar processes in the apparatus, and a reference value (Ps) is preset accordingly. When $P_k$ <Ps, the chamber is exposed to the air to clean the chamber to remove the deposited material.

In reality, however, variations due to measurement error must be considered. Further, the wafers are processed in units of batches, usually 25 wafers at one time, and it is preferable to avoid interrupting the batch-processing.

Hence, an average ($P_{ave}$) of $P_k$ for each batch is calculated, and at the end of each batch, $P_{ave.}$ and Ps are compared. If it is determined that $P_{ave.}$<Ps, the process does not proceed to the next batch, but moves to the apparatus cleaning operation. This method not only cancels the measurement errors of $P_k$, but also allows a batch-processing.

The measurement of reflected light intensity, the calculation of data, and other processings mentioned above can be performed automatically by use of a microcomputer. It is also possible to inform the operator of the measured data to allow the operator to decide whether or not to perform the cleaning operation. If the cleaning of the interior of the chamber can be done automatically, the operation including the processings described so far for the apparatus can be automated.

The above description is directed to the case where the reflected light decreases as the deposited material accumulates. When, however, the reflection factor of the deposited material is higher than that of the chamber, the reflected light intensifies as the deposition progresses. In this case, therefore, when $P_k$>Ps or $P_{ave.}$>Ps, cleaning is performed.

In the embodiment, measuring the deposited material by directing light into the chamber is performed before etching. Measurement can also be made after or during etching. At present, there is a possibility that the quartz rod 19 may be damaged by the plasma. If, however, it is possible to introduce light through a material that is not damaged by plasma or to use a means that protects the light introducing member against damage by plasma, the deposited material can be analyzed even during etching.

By feeding the data back for setting the process conditions, such as etching, the process can be controlled with a higher precision. In this case, because the data collected includes information not only on the deposited material, but also on the plasma and etching, they can be fed back for the process control by using such means as spectrometry to be described later.

(3) Chemical Analysis of Deposited Material

The foregoing description concerns an example of an embodiment of this invention which may be used in wafer mass production, in which this invention is applied to a monitor for measuring the amount of deposited material. The invention can also be applied as a means for examining the chemical composition of the deposited material and the chemical reactions that occur during the course of producing the deposited material. 10 The findings obtained as a result can be utilized for the design and development of an apparatus that is intended to reduce deposition, to stabilize the process, and to optimize the process.

In the following, a method of checking the chemical state of deposited material and the surface of the apparatus will be described.

Figure 6:
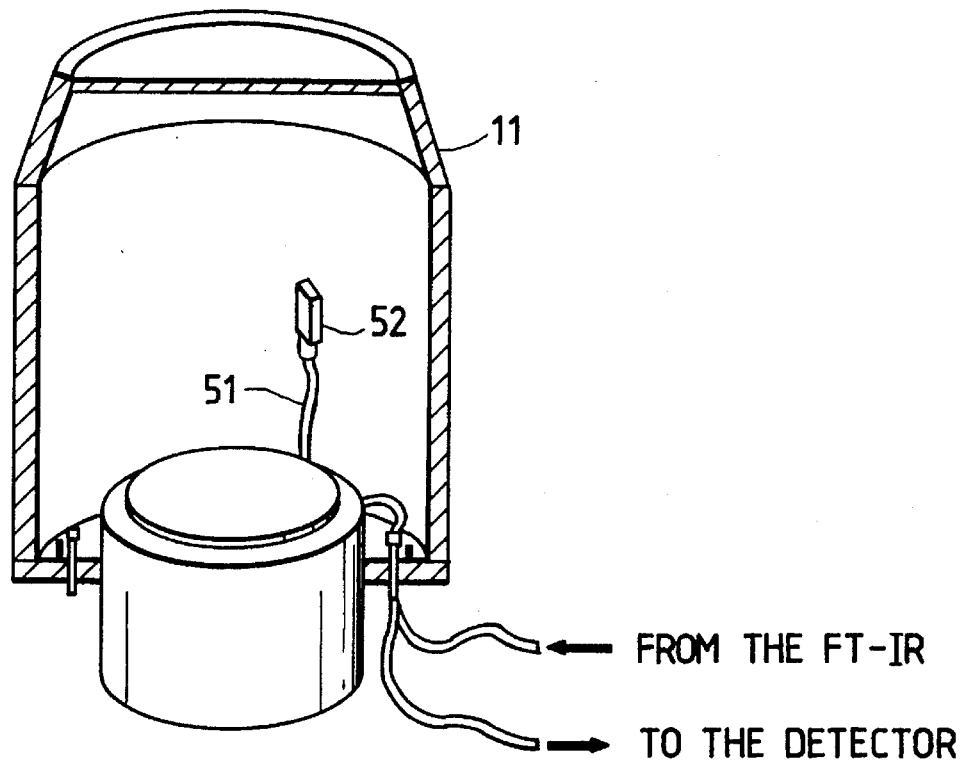
FIG. 6 is a partly sectional perspective view of a device forming an embodiment of this invention, explaining measurement using an optical fiber.

FIG. 6 shows a method of introducing infrared light into the apparatus by means of an optical fiber to analyze the chemical state of the deposited material in the apparatus by infrared spectrometry. Infrared light is introduced into an optical fiber 51, and transmitted through it to a probe 52 installed inside the chamber 11.

Figure 7:
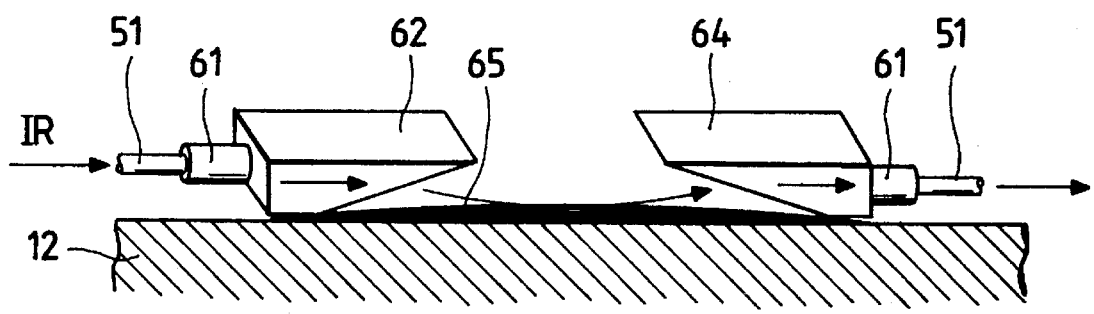
FIG. 7 is a diagrammatic view for explaining measurement using a probe for analyzing the surface of the chamber and the deposited material according to an embodiment of this invention.

An enlarged view of the probe 52 is shown in FIG. 7. The infrared light that has traveled through the optical fiber 51 is collected by a lens adapter 61 before being directed to a prism 62. The prism 62 is made of a material, such as quartz, ZnSe or Kbr, which can transmit light in the wavelength range to be measured. A lens in the lens adapter 61 is also formed of a material having similar properties.

The optical fiber 51 may, for example, be a "hollow waveguide for carbon dioxide gas laser light" of the type made by Hitachi Cable, Ltd. The optical fiber 51 and the lens adapter 61 are both contained in a sheath of stainless steel or aluminum for protection against damage from gases and plasma used in the process.

The light going out of the prism 62 is reflected by the surface of the chamber or wafer 12 and collected by a light-collecting prism 64, from which it is introduced through the lens adapter 61 into the optical fiber 51 that transmits light out of the chamber 11. The light is then subjected to spectrometry to examine the absorption spectrum, thus leading to necessary findings on the deposited material 65 adhering to the surface of the chamber or wafer 12 and also on the chemical state of the surface itself.

Polarizing the infrared light and limiting the angle of incidence at which the light strikes the surface of the chamber or wafer improves the sensitivity of analysis. For example, the polarization direction is preferably perpendicular to the surface of the chamber and of the wafer 12 and the angle of incidence is preferably about 80 degrees with respect to the normal of the surface. The method of polarizing and limiting the angle of incidence is referred to as high sensitivity reflection infrared spectroscopy, which is described in detail in "Surface Infrared and Raman Spectroscopy", Suetaka, from p. 7 on, IPC.

The infrared spectrometer may, for example, be a "Galaxy FT-IF 7000A" of Mattson make. A "double modulation FT-IR" from the same maker, which is capable of performing analysis while changing the polarization direction of infrared light in steps of several kHz, permits a surface analysis with a higher precision.

Figure 8:
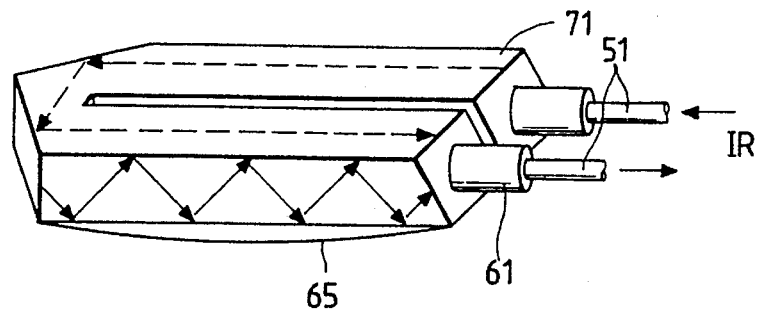
FIG. 8 is a perspective view of a portion of the embodiment of this invention that analyzes the deposited material on the probe surface.

FIG. 8 shows another example of a probe of a different type. This is used as a probe to check the state of deposited material 65 that accumulates on the internal reflection prism 71. Infrared light that has passed through the optical fiber 51 and the lens adapter enters the internal reflection prism 71, in which it undergoes repetitive internal reflection before being introduced through the lens adapter 61 and optical fiber 51 into the infrared spectrometer.

As the light undergoes internal reflection, light of particular wavelengths is absorbed at a high degree by the surface of the internal reflection prism 71 and by the material 65 deposited on the prism surface. The absorption spectrum leads to findings on the states of the deposited material 65 and of the surface. Among the method of analyzing the prism surface by the internal reflection there is an ATR method, which is described in detail in "Surface Infrared and Raman Spectroscopy", from p. 73 on, IPC.

Figure 9:
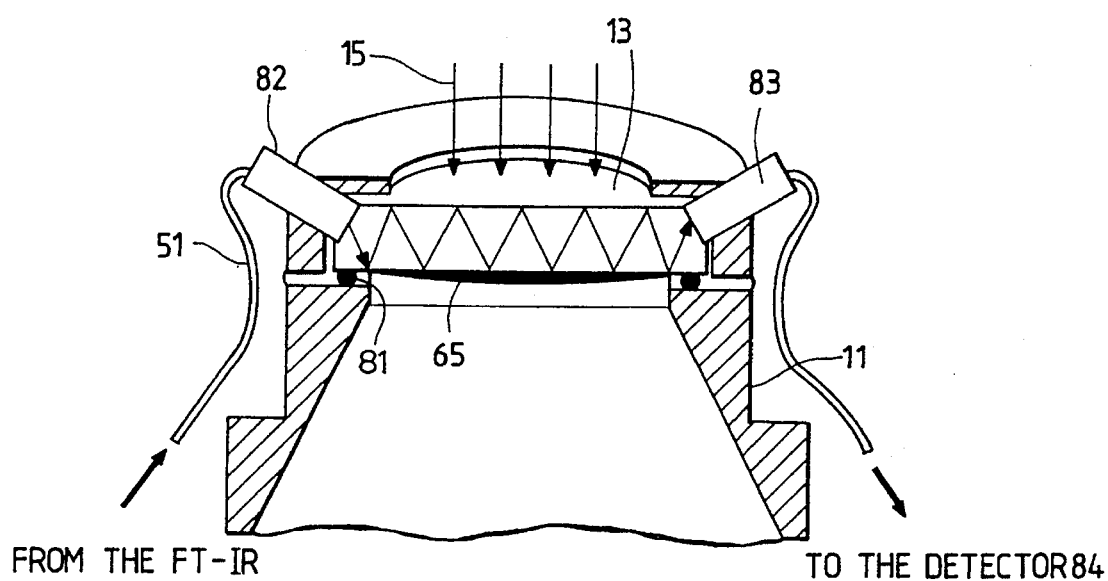
FIG. 9 is a partly sectional perspective view of a portion of a device according to an embodiment of this invention, illustrating the analysis of the state of the window surface and the deposited material.

Next, a method of analyzing the surface of a window attached to the apparatus will be explained. FIG. 9 shows the method of analyzing the deposited material adhering to the window by measuring the internal reflection of the window. In a microwave plasma etching apparatus, the chamber is provided with a quartz window 13, through which microwaves 15 are introduced into the chamber 11. By using the surface of the quartz window 13, for the measurement the material 65 adhering to window and the material deposited at other parts of the interior of the chamber are analyzed.

The interior of the chamber 11 is evacuated to a vacuum or filled with a highly pure gas, so that an O-ring 81 of fluororubber is used to form a seal between the quartz window 13 and the chamber 11. Infrared light is introduced through the optical fiber 51 into an incoming light adapter 82. The incoming light adapter 82 has a function of keeping the light from diffusing excessively in the quartz window 13 and introducing it with a high efficiency. The infrared light is projected into the inside of the window from an edge part of the quartz window 13. The infrared light undergoes repetitive reflection inside the window before collected through a light receiving adapter 83 into the optical fiber 51, which directs the received light to a detector 84.

When material 65 is deposited on the surface of the quartz window 13, light of particular wavelengths are absorbed by the deposited material. So, by analyzing the light coming out of the quartz window 13, it is possible to determine the composition and chemical bond of the deposited material 65.

This allows an analysis of the deposited material adhering to the inner surface of the window without exposing the apparatus to the air, making it possible to examine the production of the deposited material during the process without being influenced by the air. Simply by measuring the intensity of light rather than taking the trouble to perform a spectral analysis, it is possible to examine the damaged window surface and to measure the amount of deposited material.

Figure 10:
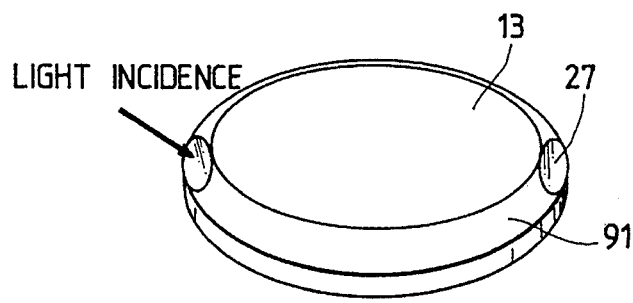
FIG. 10 is a perspective view of a window used in an embodiment of this invention.

FIG. 10 shows the shape of the window 13. The window 13 has a tapered edge 91 so that its cross section is trapezoidal. From the surface of this tapered edge, infrared light is introduced and repetitively reflected inside the window until it comes out from the opposite side. In the tapered edge 91, flat portions 27 are formed, through which light can enter and exit, in order to make it difficult for the incoming light to be diffused inside the window, thus increasing the amount of light coming out of the exit and facilitating the analysis. The light entrance and exit portions may take the form of a concave or convex surface having a lens function.

In the foregoing, the method of examining the chemical state of deposited material has been described. Spectrometry is classed largely into two methods. One is introducing light of only a particular wavelength and measuring the intensity of light that comes out without being absorbed. The second is introducing light of a wide wavelength range and analyzing light that comes out without being absorbed. This invention may use either of these methods. Although the embodiment uses infrared light, it is possible to use light of various wavelengths, such as ultraviolet light and visible light, and electromagnetic waves.

The location of measurement is not limited to one, location and two or more locations may be analyzed at one time or by scanning.

As described above, the chemical state of the deposited material and of the chamber surface is analyzed, and it is possible to know the influences on the mechanism of deposition generation, the corrosion of the chamber surface and the etching. This in turn makes it possible to realize a high-quality processing by monitoring an apparatus and examining the process.

The result of analysis can be fed back to the process, control during a process or during intervals between processes, thus allowing a more precise automatic control of the processes and feedback of the process state to the operators.

What has been described above is not limited to microwave plasma etching apparatuses, but can be applied to any type of semiconductor device manufacturing apparatus.

Further, the invention can be applied not only to semiconductor device manufacturing apparatuses, but also to any apparatus or machine whose inner or outer surface is required to be examined.

According to the present invention, in a semiconductor device manufacturing apparatus, such as an etching apparatus, the invention enables a relatively inexpensive monitoring of changes in the amount of deposited material adhering to the interior of the apparatus without exposing the apparatus to the air. And, using spectrometry, it makes it possible to analyze the deposited material on the inner surface of the reactor.

Based on the data collected, the timing of cleaning of the apparatus to remove the deposited material, an operation requiring that the apparatus be exposed to the air, can be determined more precisely by a conventional method. This in turn reduces the frequency of exposure to the air and prevents an accidental failure of the apparatus.

In examining the state and mechanism of deposition by taking drastic measures, conventional methods have been very restricted, since only the state of deposition after the exposure to the air can be examined. This invention, however, makes it possible to check how material is being deposited during a process and to examine the deposited material remaining after the process without exposing the apparatus to the air. In other words, the deposition generation mechanism and the state of the deposited material remaining after the cleaning process can be directly examined, which has not been possible by conventional methods. This invention therefore offers an important means to establish an effective method of reducing deposited material.

We claim:

1. A semiconductor device manufacturing apparatus filled with a processing gas, comprising:

a chamber;

a transparent member installed in the chamber and capable of transmitting light;

light application means for introducing light into the chamber through the transparent member to illuminate the interior of the chamber with the light; and measuring means for performing at least one of spectrometry and photometry on reflected light from the chamber;

wherein a state of the interior of the chamber can be monitored without exposing the chamber to air.

2. A semiconductor device manufacturing apparatus filled with a processing gas, comprising:

a chamber;

a first transparent member installed in the chamber to introduce light into the chamber;

a second transparent member installed in the chamber to take out light reflected from the inner surface of the chamber itself; and measuring means for performing at least one of spectrometry and photometry on reflected light that has passed through the second transparent member.

3. A semiconductor device manufacturing apparatus filled with a processing gas, comprising:

a chamber;

a member installed in the chamber and capable of transmitting light into the chamber; and measuring means for performing at least one of spectrometry and photometry of multiply-reflected light that has been reflected inside the transparent member;

wherein the measuring means includes means for measuring at least one of the amount, composition and property of material adhering to a surface of the transparent member to allow monitoring of a state of interior of the chamber without exposing the chamber to air.

4. A semiconductor device manufacturing apparatus filled with a processing gas, comprising:

a chamber;

at least one transparent member installed in the chamber and capable of transmitting light;

a light source for introducing external light into the chamber through an optical fiber optically connected to the at least one transparent member; and measuring means for performing at least one of spectrometry and photometry on multiply-reflected light that has been reflected inside the at least one transparent member.

5. A semiconductor device manufacturing apparatus according to claim 1, further comprising a mechanism for moving the transparent member.

6. A semiconductor device manufacturing apparatus according to claim 1, further comprising a shutter to cover the transparent member.

7. A semiconductor device manufacturing apparatus according to claim 1, further comprising evacuation means for evacuating the chamber to a vacuum.

8. A semiconductor device manufacturing apparatus according to claim 1, further comprising a processing gas supply means that supplies a processing gas to the chamber.

9. A semiconductor device manufacturing method comprising the steps of:

introducing light into a chamber of a semiconductor device manufacturing apparatus through a transparent member provided in the chamber;

detecting light which has been reflected at the interior of the chamber; and performing at least one of spectrometry and photometry on reflected light to monitor a state of the interior of the chamber without exposing the chamber to air.

10. A semiconductor device manufacturing method comprising the steps of:

reflecting light inside a transparent member so arranged that one end thereof faces inside a chamber of a semiconductor device manufacturing apparatus; and performing at least one of spectrometry and photometry on multiply-reflected light from the chamber to measure at least one of the amount, composition and property of material adhering to a surface of the transparent member to monitor a state of the interior of the chamber without exposing the chamber to air.

11. A semiconductor device manufacturing method comprising the steps of:

introducing external light into a chamber of a semiconductor device manufacturing apparatus through an optical fiber optically connected to a transparent member so arranged that one end thereof faces inside the chamber;

taking out multiply-reflected light that has been reflected inside the transparent member; and performing at least one of spectrometry and photometry on the multiply-reflected light to allow monitoring of a state of the interior of the chamber while the process is under way.

12. A semiconductor device manufacturing method according to claim 10, wherein said state of the interior of the chamber is at least one of a state of material deposited on the inner surface of the chamber, a chemical reaction, and a state of a processing performed in the chamber.

13. A semiconductor device manufacturing method according to claim 10, wherein the transparent member is a window provided in the chamber, and wherein a microwave is introduced into the chamber through the window, light is introduced into the window from a side of the window, light that has been reflected inside the window is taken out from a side of the window, and at least one of spectrometry and photometry on the taken out reflected light is performed to measure at least one of the amount and property of material deposited on the inner side of the window of the chamber while a processing is being carried out in the chamber.

14. A semiconductor device manufacturing method according to claim 10, wherein monitoring of a state of the interior of the chamber is performed before or after at least one of the processings of deposition on a wafer, etching and exposure is performed in the chamber.

15. A semiconductor device manufacturing method according to claim 10, wherein, based on results of measurement of light reflected inside the chamber or the transparent member, an instruction to clean the chamber by removing material adhering to the interior of the chamber is displayed.

16. A semiconductor device manufacturing method according to claim 10, wherein at least one of start, stop and control of the processing of removing material adhering to the interior of the chamber is automatically performed based on results of measurement of light reflected inside the chamber or the transparent member.

17. A semiconductor device manufacturing method according to claim 10, wherein at least one of results of measurement and a state of process is displayed based on results of measurement of light reflected inside the chamber or the transparent member.

18. A semiconductor device manufacturing method according to claim 10, wherein a state of a process is controlled based on results of measurement of light reflected inside the chamber or the transparent member.

19. A semiconductor device manufacturing method according to claim 11, wherein the introduced light or taken-out light is infrared light.

20. A semiconductor device manufacturing method according to claim 10, wherein analyzing of the light is performed using a Fourier-transform spectroscopy.

21. A semiconductor device manufacturing apparatus forming a dry-etching apparatus which comprises:

a chamber in which a processing is performed;

gas introducing means for introducing a processing gas into the chamber;

a magnet for generating a magnetic field;

an electromagnetic wave source to generate an electromagnetic wave;

a transparent member mounted on the chamber and capable of transmitting light;

light introducing means for introducing light into the chamber through the transparent member; and measuring means for performing at least one of spectrometry and photometry on reflected light from the chamber to allow monitoring of a state of the interior of the chamber without exposing the chamber to air.

22. A semiconductor device manufacturing apparatus forming a dry-etching apparatus which comprises:

a chamber in which a processing is performed;

gas introducing means for introducing a processing gas into the chamber;

a magnet for generating a magnetic field;

an electromagnetic wave source to generate an electromagnetic wave;

a first transparent member for introducing light into the chamber;

a second transparent member for taking out light reflected from the inner surface of the chamber itself; and measuring means for performing at least one of photometry and spectrometry on light that has passed out of the chamber through the second transparent member.

23. A semiconductor device manufacturing apparatus forming a dry-etching apparatus which comprises:

a chamber in which a processing is performed;

gas introducing means for introducing a processing gas into the chamber;

a magnet for generating a magnetic field;

an electromagnetic wave source to generate an electromagnetic wave;

a transparent member provided on the chamber and capable of transmitting light; and measuring means for performing at least one of spectrometry and photometry on multiply-reflected light that has been reflected inside the transparent member;

wherein the measuring means includes means for measuring at least one of the amount, composition and property of material adhering to a surface of the transparent member to allow monitoring of a state of the interior of the chamber without exposing the chamber to air.

24. A semiconductor device manufacturing apparatus forming a dry-etching apparatus which comprises:

a chamber in which a processing is performed;

gas introducing means for introducing a processing gas into the chamber;

a magnet for generating a magnetic field;

an electromagnetic wave source to generate an electromagnetic wave;

a transparent member provided on the chamber and capable of transmitting light;

light introducing means for introducing external light into the chamber through an optical fiber optically connected to the transparent member;

light take-out means for taking out, through the optical fiber, multiply-reflected light that has been internally reflected inside the transparent member; and measuring means for performing at least one of spectrometry and photometry on the multiply-reflected light.

25. A semiconductor device manufacturing method for manufacturing a functional member having a thin film, comprising the steps of:

introducing light into a chamber of a semiconductor device manufacturing apparatus to illuminate the interior of the chamber with light;

performing at least one of spectrometry and photometry on reflected light from the chamber to monitor a state of the interior of the chamber without exposing the chamber to air; and forming a thin film over a surface of the functional member within the chamber.

26. A semiconductor device manufacturing method for manufacturing a functional member having a thin film, comprising the steps of:

performing at least one of spectrometry and photometry on multiply-reflected light that has been internally reflected inside a transparent member facing inside the chamber of a semiconductor device manufacturing apparatus so as to measure at least one of the amount, composition and property of material adhering to a surface of the transparent member and thereby to monitor a state of the interior of the chamber without exposing the chamber to air; and forming a thin film over a surface of the functional member within the chamber.

* * * * *